US008916472B2

United States Patent
Hu et al.

(10) Patent No.: US 8,916,472 B2
(45) Date of Patent: Dec. 23, 2014

(54) INTERCONNECT FORMATION USING A SIDEWALL MASK LAYER

(75) Inventors: Xiang Hu, Clifton Park, NY (US); Mingmei Wang, Ballston Lake, NY (US); Liu Huang, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 270 days.

(21) Appl. No.: 13/562,426

(22) Filed: Jul. 31, 2012

(65) Prior Publication Data
US 2014/0038412 A1 Feb. 6, 2014

(51) Int. Cl.
*H01L 21/308* (2006.01)
*H01L 21/768* (2006.01)
*H01L 21/033* (2006.01)

(52) U.S. Cl.
CPC ...... *H01L 21/76811* (2013.01); *H01L 21/0337* (2013.01)
USPC .............................. 438/689; 438/428; 438/446

(58) Field of Classification Search
CPC .......................... H01L 21/308; H01L 21/0337
USPC ........................................................ 438/689
See application file for complete search history.

(56) References Cited

U.S. PATENT DOCUMENTS

| 8,198,188 | B1 | 6/2012 | Pierrat |
| 2003/0224602 | A1* | 12/2003 | Chung et al. ................ 438/689 |
| 2006/0154086 | A1* | 7/2006 | Fuller et al. ................ 428/428 |
| 2009/0246959 | A1 | 10/2009 | Geiss et al. |

* cited by examiner

*Primary Examiner* — Nadine Norton
*Assistant Examiner* — Mahmoud Dahimene
(74) *Attorney, Agent, or Firm* — Maxine L. Barasch; Keohane & D'Alessandro, PLLC

(57) ABSTRACT

Embodiments described herein provide approaches for interconnect formation in a semiconductor device using a sidewall mask layer. Specifically, a sidewall mask layer is deposited on a hard mask in a merged via region of the semiconductor device following removal of a planarization layer previously formed on the hard mask. The sidewall mask layer is conformally deposited on the hard mask, and acts like a sacrificial layer to protect the hard mask during a subsequent via etch. This reduces the via critical dimension (CD) and reduces the CD elongation along the hard mask line direction during the via etch.

18 Claims, 10 Drawing Sheets

INTERCONNECT FORMATION USING A SIDEWALL MASK LAYER

BACKGROUND

1. Technical Field

This invention relates generally to the field of semiconductors, and more particularly, to manufacturing approaches used in forming openings during interconnect processing of integrated circuits and other devices.

2. Related Art

The semiconductor manufacturing process typically includes two major components, namely the Front-End-of-Line (FEOL), which includes the multilayer process of forming semiconductor devices (transistors, etc.) on a semiconductor substrate, and the Back-End-Of-Line (BEOL), which includes the metallization after the semiconductor devices have been formed. Like all electronic devices, semiconductor devices in a microchip, such as an integrated circuit (IC), need to be electronically connected through wiring. In an integrated circuit, such wiring is done through multilayer metallization on top of the multilayered semiconductor devices formed on the semiconductor substrate. The complexity of this wiring becomes appreciable as there may be hundreds of millions or more semiconductor devices (e.g., transistors in particular) formed on a single IC. Proper connection of these devices is accomplished by multilayer metallization. Each metallization layer consists of a grid of metal lines sandwiched between one or more dielectric layers for electrical integrity. Modern semiconductor manufacturing processes can involve multiple metallization layers.

As scaling of microelectronic devices approaches sub 30 nm nodes, many material and module process challenges in BEOL plasma patterning have been reported. One of the methods that has gained traction over recent years for enabling sub 20 nm feature patterning is the Trench First Metal Hard Mask (TFMHM) scheme. While this scheme solves or mitigates many challenges that are inherent with the Via First Trench Last (VFTL) Scheme, it introduced other dielectric reactive ion etching (RIE) process and hardware challenges. One of the root causes of the former is the fact that all patterns and materials are exposed to plasma at the same time. As such, the simultaneous control of via, trench and chamfer profiles (i.e. Critical Dimensions, depth, taper profile, etc), the need to control selectivity between multiple patterning layer (Titanium Nitride (TiN), tetra-ethyl-orthosilane (TEOS), ultra low k (ULK), Barrier cap, etc), and ULK damage control has become more pertinent in the dielectric etch. As a direct result of such tight process guidelines, the hardware challenges arise and new dimensions in process controls are needed. The prolonged exposure of the TiN to the plasma created the need for more robust production worthy hardware. The required selectivity of the materials necessitate temperature controllable chucks. The more complex patterning techniques require ULK preservation and other uniformity controls.

A TFMHM Self-Alignment Via (SAV) process is used to improve the via to trench alignment margin in order to maximizes the $V_x/M_{x+1}$ spacing. Merged vias can help further reduce the via-to-via distance and thus improve the device density. Selectivity to the hardmask layer of an etch process, which is essential to enable the self-alignment, is challenging. The hardmask margin becomes worse when the merged via design is used since the hardmask is exposed to the etch process twice. The prior art device 10 of FIGS. 1-2 show this challenge. FIG. 1A (cross-sectional view) and FIG. 1B (top view) demonstrate a prior art device 10 including a substrate 2, a capping layer 4 (e.g., nitrogen-doped silicon carbide or $SiN_xC_yH_z$(NBLoK)) formed over substrate 2, an interdielectric layer 6 formed over capping layer 4, a hard mask layer 8 (e.g., a TEOS hard mask layer), and a hard mask 14 formed over hard mask layer 8. Device 10 further comprises a plurality of vias 12 in a merged via region 'R1' following a via etch and strip process. As shown, 'R2' represents a non-merged region of device 10. FIGS. 2A-B represent device 10 of FIGS. 1A-B, respectively, following a trench etch. In this prior art approach, hard mask 14 (e.g. TiN) is exposed to the via etch and the subsequent trench etch, which forms vias 12 and a plurality of trenches 16. However, as demonstrated, an insufficient margin for hardmask 14 causes the hard mask 14 to break (highlighted by reference numeral 18 in FIG. 2A) during the merged via etch and the subsequent trench etch. This may result in a metal line to metal line short following metal chemical-mechanical polishing (CMP) in subsequent fabrication.

The hardmask loss in current art approaches occurs in two directions, vertically and horizontally. It is known the more robust the hardmask, the better protection for the material underneath the hardmask. On the other hand, process selectivity to the hardmask material can be improved by adjusting process parameters such as process chemistry and process temperature, etc. In order to improve the hardmask selectivity, the amount of polymering gas such as $C_4F_8$ is increased and the lower process temperature is used. However, the polymer residue risk becomes higher with increasing the $C_4F_8$ flow and lowering the process temperature. Physically increasing the hardmask thickness can provide better hardmask protection. However, it would result in too big an aspect ratio, which may cause a subsequent metal filling defect (e.g. void). Reducing the SAV etch time may help reduce the hardmask loss. However, the reduced SAV etch time causes the via open issue as a result of the under etch of dielectric material. As such, current art approaches are inadequate for at least one of the reasons described above.

SUMMARY

In general, embodiments of the invention provide an approach for interconnect formation in a semiconductor device using a sidewall mask layer. Specifically, a sidewall mask layer is deposited on a hard mask layer following removal of a previously formed planarization layer. The sidewall mask layer is conformally deposited on the hard mask in a merged via region of the semiconductor device, and acts like a sacrificial layer to protect the hard mask layer during a subsequent via etch. This reduces the via critical dimension (CD) and reduces the CD elongation along the hard mask line direction during the via etch. The sidewall mask layer improves the hard mask margin for the via etch without sacrificing metal filling capability and defect-related performance.

One aspect of the present invention includes a method for forming a device, the method including: providing an integrated circuit (IC) structure including: an interdielectric layer (IDL) formed over a substrate and a capping layer; a hard mask layer formed over the IDL; a hard mask formed over the hard mask layer, the hard mask including a plurality of openings formed therein; and a planarization layer formed over the hard mask in a merged via region of the device; removing the planarization layer exposed by an opening in a masking structure formed over the planarization layer; and forming a sidewall mask layer over the hard mask.

Another aspect of the present invention includes a method for interconnect formation, the method including: providing a hard mask formed over an interdielectric layer (IDL) of an integrated circuit (IC) structure, the hard mask including a plurality of openings formed therein; removing a planarization layer formed over the hard mask; forming a sidewall mask layer over the hard mask in a merged via region of the IC structure; and forming a plurality of vias in the IC structure through the plurality of openings of the hard mask.

Another aspect of the present invention provides a method for forming a semiconductor device, the method including: removing an organic planarization layer formed over a hard mask of the semiconductor device; forming a sidewall mask layer over the hard mask in a merged via region of the device; etching the sidewall mask layer to expose an interdielectric layer of the device; and forming a plurality of vias in the semiconductor device through a plurality of openings of the hard mask.

BRIEF DESCRIPTION OF THE DRAWINGS

These and other features of this invention will be more readily understood from the following detailed description of the various aspects of the invention taken in conjunction with the accompanying drawings in which.

Figure 1A:
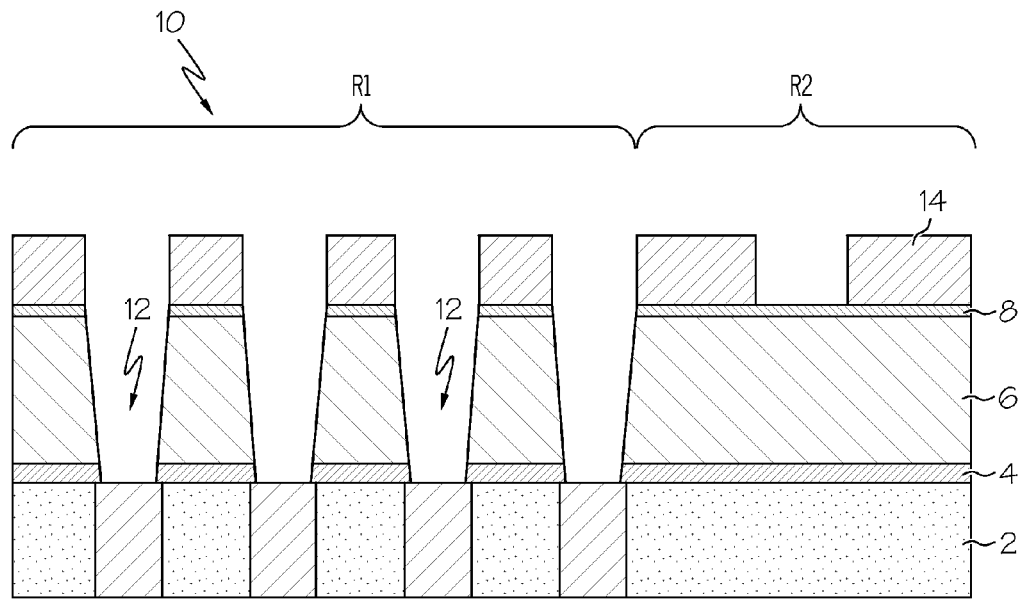
FIG. 1A shows a cross-sectional view of a prior art semiconductor device following a via etch.
Figure 1B:
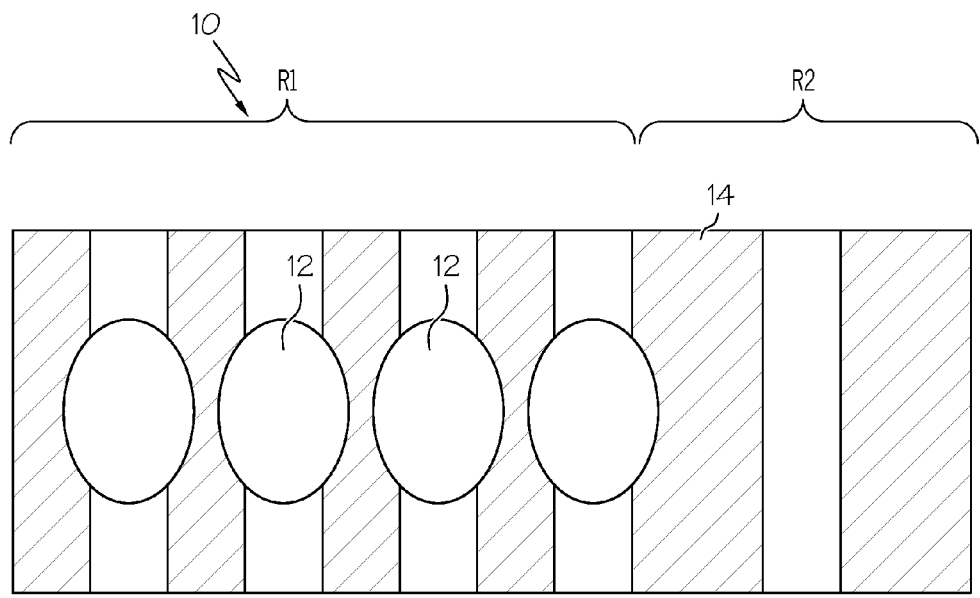
FIG. 1B shows a top view of the prior art semiconductor device of FIG. 1A following the via etch.
Figure 2A:
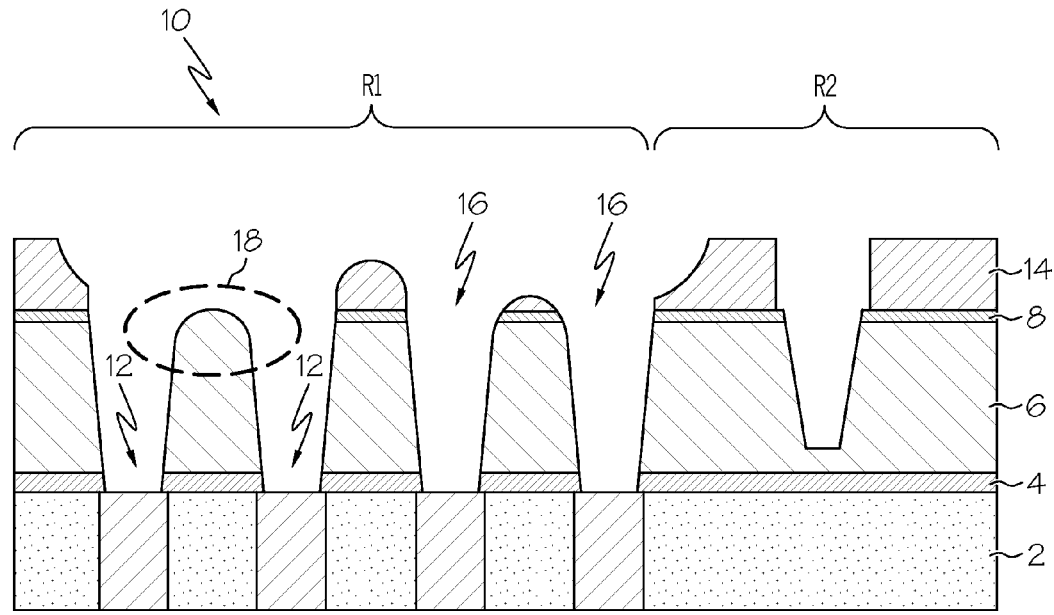
FIG. 2A shows a cross-sectional view of a prior art semiconductor device following a trench etch.
Figure 2B:
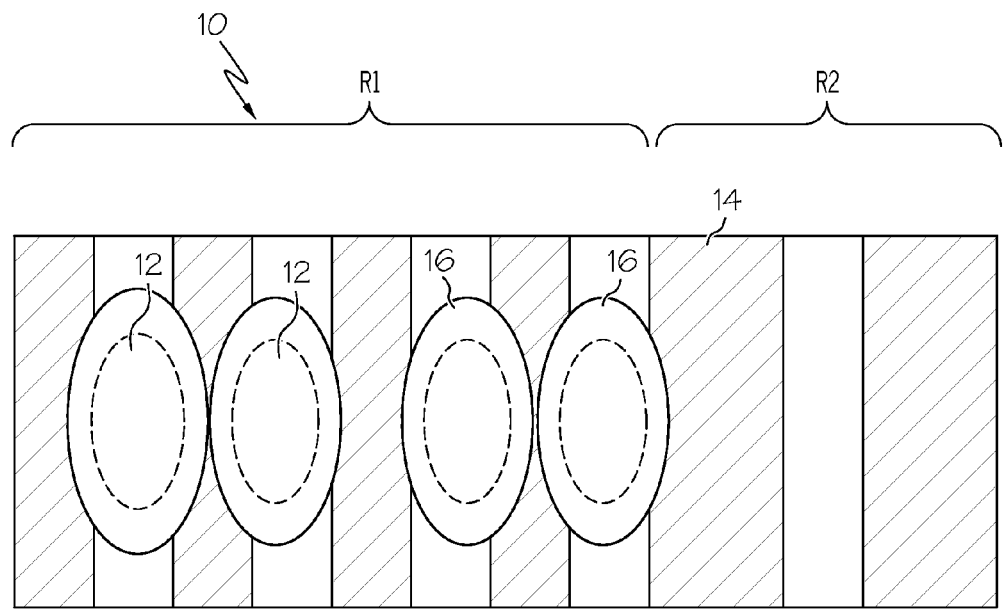
FIG. 2B shows a top view of the prior art semiconductor device of FIG. 2A following the trench etch.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are methods and techniques used in forming vias, trenches and other openings during interconnect processing of integrated circuits and other devices. Specifically, exemplary embodiments of the invention provide approaches for interconnect formation in a semiconductor device using a sidewall mask layer. The sidewall mask layer is deposited on a hard mask in a merged via region of the semiconductor device following removal of a planarization layer previously formed on the hard mask. The sidewall mask layer is conformally deposited on the hard mask, and acts like a sacrificial layer to protect the hard mask during a subsequent via etch. This reduces the via critical dimension (CD) and reduces the CD elongation along the hard mask line direction during the via etch. The sidewall mask layer improves the hard mask margin for the via etch without sacrificing metal filling capability and defect-related performance.

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

Figure 3:
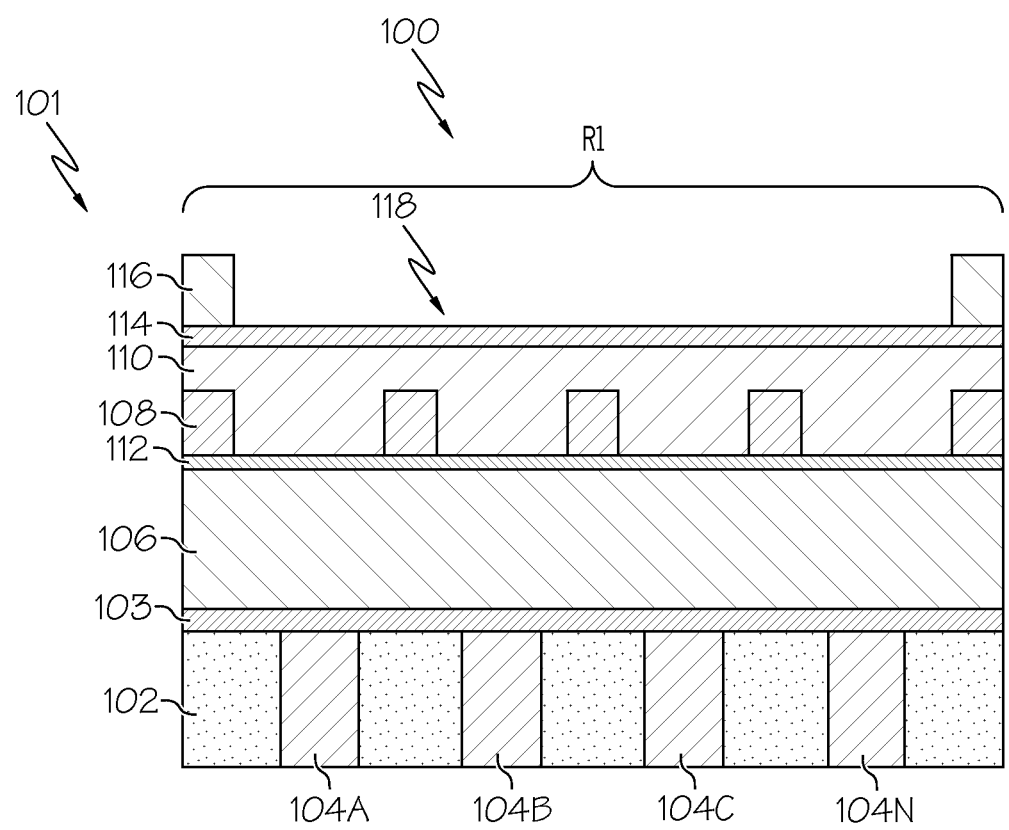
FIG. 3 shows a cross-sectional view of a device during its manufacture according to illustrative embodiments.

With reference again to the figures, FIG. 3 shows a cross section of a device 100 according to illustrative embodiments. Device 100 comprises an integrated circuit (IC) structure 101 including a substrate 102, in which metal lines 104A-N have been formed. A capping layer 103 (e.g., nitrogen-doped silicon carbide or $SiN_xC_yH_z$ (NBLoK)) has been formed over substrate 102. An interdielectric layer (IDL) 106 has been formed on capping layer 103, a masking layer 112 (e.g., a tetra-ethyl-ortho-silane (TEOS) hard mask layer) and a hard mask 108 (e.g., TiN) has been formed over IDL 106, and a planarization layer 110 has been formed over masking layer 112 and hard mask 108. On top of planarization layer 110 is an anti-reflective layer 114 and a masking structure 116. An opening 118 in masking structure 116 is then patterned, for example, using a photo-lithography processes or other lithographic process (e.g., electron beam lithography, imprint lithography, etc.). In exemplary embodiments, opening 118 is patterned in a merged via region 'R1' of device 100. Region R1 represents an area in device 100 in which two or more adjacent vias may be connected to a same metal layer. Since masking structure 116 merges adjacent vias, etching IDL 106 over the metal layer results in the formation of the vias which connect the underneath metal lines 104A-N later in device fabrication. It will be appreciated that IC structure 101 may comprise additional or fewer layers in alternative embodiments without departing from the spirit and scope of the invention. For example, IC structure 101 may comprise substrate 102, IDL 106, hard mask 108, planarization layer 110, anti-reflective layer 114 and masking structure 116. In this embodiment, IC structure does not include capping layer 103 or masking layer 112, for example.

IC structure 101 may be formed, for example, in a lithographic stepper including multiple spin coating stations and at least one curing chamber so that the materials of IC structure 101 may be formed within the lithographic stepper in a single processing step. Alternately, multiple lithographic steppers and/or dedicated curing tools may be employed to form IC structure 101.

The substrate 102 may be any silicon containing substrate including, but not limited to Silicon (Si), bulk Si, single crystal Si, polycrystalline Si, Silicon-Germanium (SiGe), amorphous Si, silicon-on-insulator substrates (SOI), SiGe-on-insulator (SGOI), strained-silicon-on-insulator, annealed poly Si, and poly Si line structures. In one embodiment, when substrate 102 is a silicon-on-insulator (SOI) or SiGe-on-insulator (SGOI) substrate, the thickness of the semiconducting Si-containing layer atop the buried insulating layer (not shown) may be 10 nm or greater. In one embodiment, the SOI or SGOI substrate may be fabricated using a thermal bonding process, or alternatively may be fabricated by an ion implantation process, such as separation by ion implantation of oxygen (SIMOX).

In exemplary embodiments, IDL 106 is preferably octamethylcyclotetrasiloxane (OMCTS) or an ultra low k (ULK) dielectric, i.e., a dielectric material having a dielectric constant lower than 3.9, which is the dielectric constant of silicon dioxide ($SiO_2$). The low-k or ULK dielectric material may be deposited by chemical vapor deposition (CVD). Chemical vapor deposition (CVD) is a deposition process in which a deposited species is formed as a result of a chemical reaction between gaseous reactants at greater than room temperature, wherein the solid product of the reaction is deposited on the surface on which a film, coating, or layer of the solid product is to be formed. Variations of CVD processes include, but are not limited to: Atomic layer deposition, Atmospheric Pressure CVD (APCVD), Low Pressure CVD (LPCVD), Plasma Enhanced CVD (EPCVD), Metal-Organic CVD (MOCVD) and combinations thereof. Furthermore, the ULK dielectric material may also be deposited using a conformal deposition method.

Hard mask 108 is a layer of a metallic material (e.g., a TiN HM is used because of its high selectivity to the IDL etch process) or a dielectric material that is employed as a masking layer. Hard mask 108 may also be a silicon nitride layer, a silicon oxide layer, a silicon oxynitride layer, or a combination thereof. The thickness of dielectric hard mask 108 may be from 5 nm to 50 nm, and preferably from 7.5 nm to 30 nm, although lesser and greater thicknesses are also contemplated herein.

In exemplary embodiments, planarization layer 110 includes an organic planarizing material. The organic planarizing material may be an organic polymer including Carbon (C), Hydrogen (H), and Nitrogen (N). The thickness of planarizing layer 110 may be from 60 nm to 600 nm, and preferably from 100 nm to 300 nm, although lesser and greater thicknesses are also contemplated herein. Planarization layer 110 is blanket deposited on hard mask 108 utilizing a deposition process. Examples of deposition processes that can be used in forming planarization layer 110 may include, but are not limited to, spin coating, CVD (chemical vapor deposition), PVD (physical vapor deposition), ALD (atomic layer deposition), sputtering or evaporation.

Anti-reflective layer 114 includes a material that reduces light reflection at the wavelengths of illumination on masking structure 116, and may be formed by any conventional method of forming a lithographic material layer, e.g., spin coating. In exemplary embodiments, anti-reflective layer 114 may include an organic material including a light absorber material and a polymer material. For example, anti-reflective layer 114 may include a crosslinking agent component substituted by a hydroxylalkyl group or an alkoxyalkyl group, a benzophenone-based, diphenylsulfone-based or diphenylsulfoxide-based dye component and an acrylic resin. Anti-reflective layer 114 may also be a Si-containing anti-reflection layer, i.e., include silicon in the composition of the material. The composition of anti-reflective layer 114 may be optimized depending on the composition of masking structure 116. The thickness of anti-reflective layer 114 may be from 10 nm to 200 nm, and typically from 20 nm to 120 nm, although lesser and greater thicknesses are also contemplated herein.

Masking structure 116 is formed on the top surface of anti-reflective layer 114, for example, by spin coating. Masking structure 116 includes a material that is photosensitive at a wavelength range. For example, masking structure 116 may include a deep ultraviolet (DUV) photoresist, a mid-ultraviolet (MUV) photoresist, an extreme ultraviolet (EUV) photoresist, or an electron beam (e-beam) photoresist. The material of masking structure 116 reacts to illumination and is chemically changed, for example, by cross-linking, in the wavelength range within which Masking structure 116 is photosensitive. Masking structure 116 may include a variety of types of masking structures. In one embodiment, masking structure 116 comprises refractive or reflective masking structures including, for example, optical, extreme ultraviolet (EUV), and/or x-ray technologies. Optical masking structures include, for example, 157 nanometer (nm), 193 nm, 248 nm, and/or 365 nm masks, but may also include masks suited for smaller geometries (i.e., 45 nm, 32 nm, and beyond). An optical masking structure may generally include materials such as quartz or various types of silica including fused silica and chrome, chrome oxide, and/or chrome oxynitride or molybdenum silicide, but may include other materials in other embodiments. An EUV masking structure may include a ruthenium (Ru) capped molybdenum silicon (MoSi) multilayer blank among other materials and/or structures. EUV masking structures may also comprise a low thermal expansion material (LTEM). Masking structure 116 may be used in immersion technologies in other embodiments.

Figure 4:
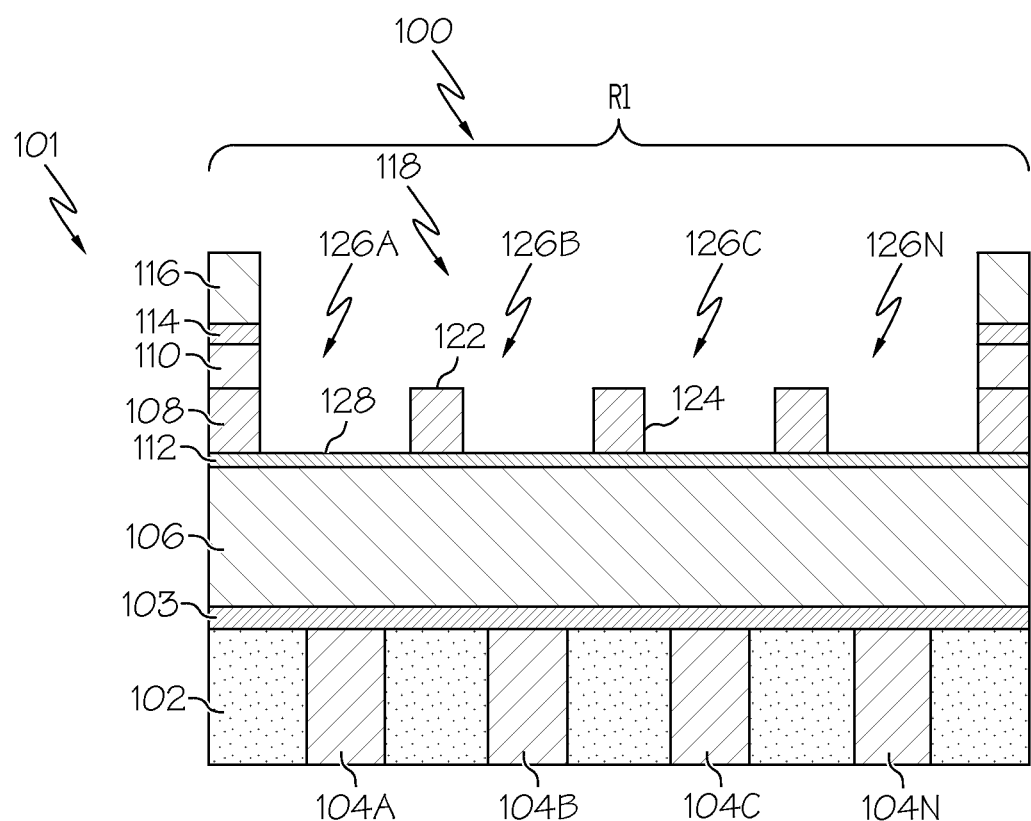
FIG. 4 shows a cross-sectional view of the device following a planarization removal process according to illustrative embodiments.

As shown in FIG. 4, during processing, a portion of planarization layer 110 exposed by opening 118 in masking structure 116 is removed. Specifically, anti-reflective layer 114 is etched first, followed by planarization layer 110 surrounding a top surface 122 and sidewall surfaces 124 of a plurality of openings 126A-N formed through hard mask 108. In exemplary embodiments, anti-reflective layer 114 is dry-etched using a floured-based chemistry, while planarization layer 110 is dry-etched using organic chemistry such as $O_2$, $CO_2$, $H_2$ or $N_2$ based chemistry. The etch process proceeds until essentially all of planarization layer 110 has been etched. As shown, planarization layer 110 is etched through to a top surface 128 of masking layer 112.

Figure 5:
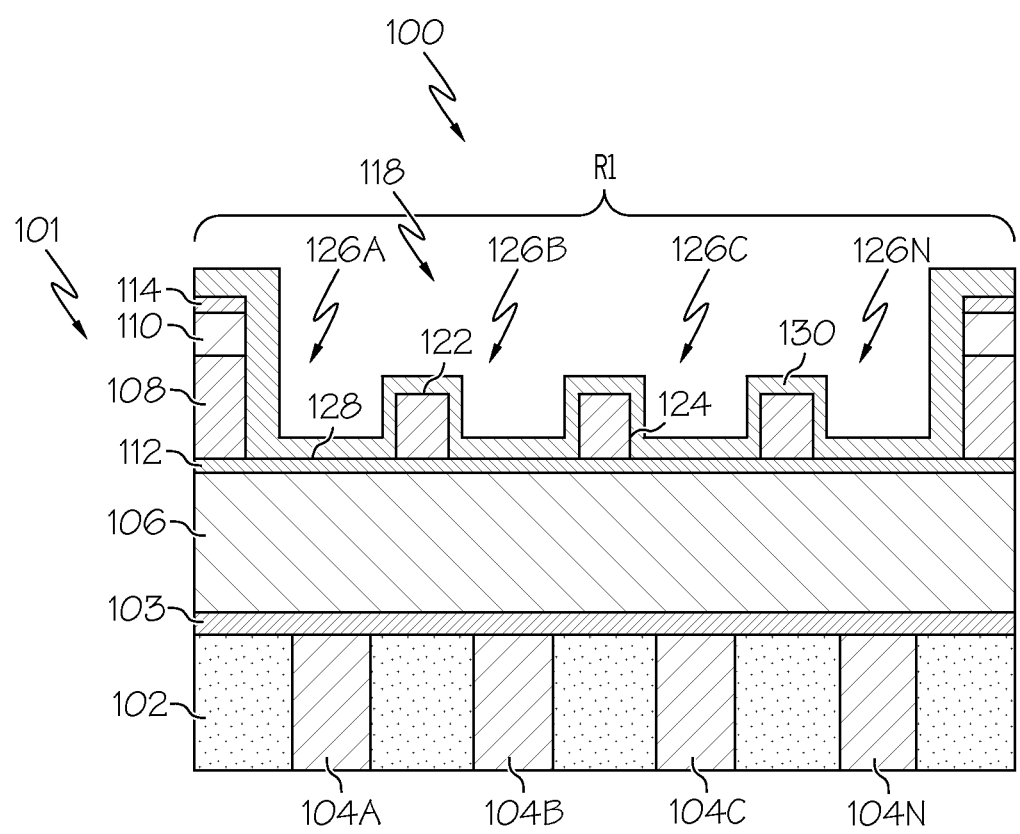
FIG. 5 shows a cross-sectional view of the device following formation of a sidewall mask layer according to illustrative embodiments.

After anti-reflective layer 114 and planarization layer 110 are removed, a sidewall mask layer 130 is formed over masking structure 116 and hard mask 108, by way of opening 118, as shown in FIG. 5. In exemplary embodiments, sidewall mask layer 130 is created by conformally depositing a sidewall mask material (e.g., a carbon-based material, an oxide material, or a nitride material) over masking layer 112, hard mask 108 and plurality of openings 126A-N. As shown, sidewall mask layer 130 conforms to top surface 122 and sidewall surfaces 124 of hard mask 108, as well as top surface 128 of masking layer 112. In exemplary embodiments, the sidewall mask material can be conformally deposited using an ex-situ thin film deposition, or an in-situ deposition in an etch chamber. Ex-situ thin film deposition includes an ALD process where pre-treatments, depositions, and post-treatments are each carried out in a separate system. In-situ deposition, meanwhile, does not require transfer between process chambers between pre-deposition oxidation treatments, ALD, and post-deposition annealing.

Figure 6:
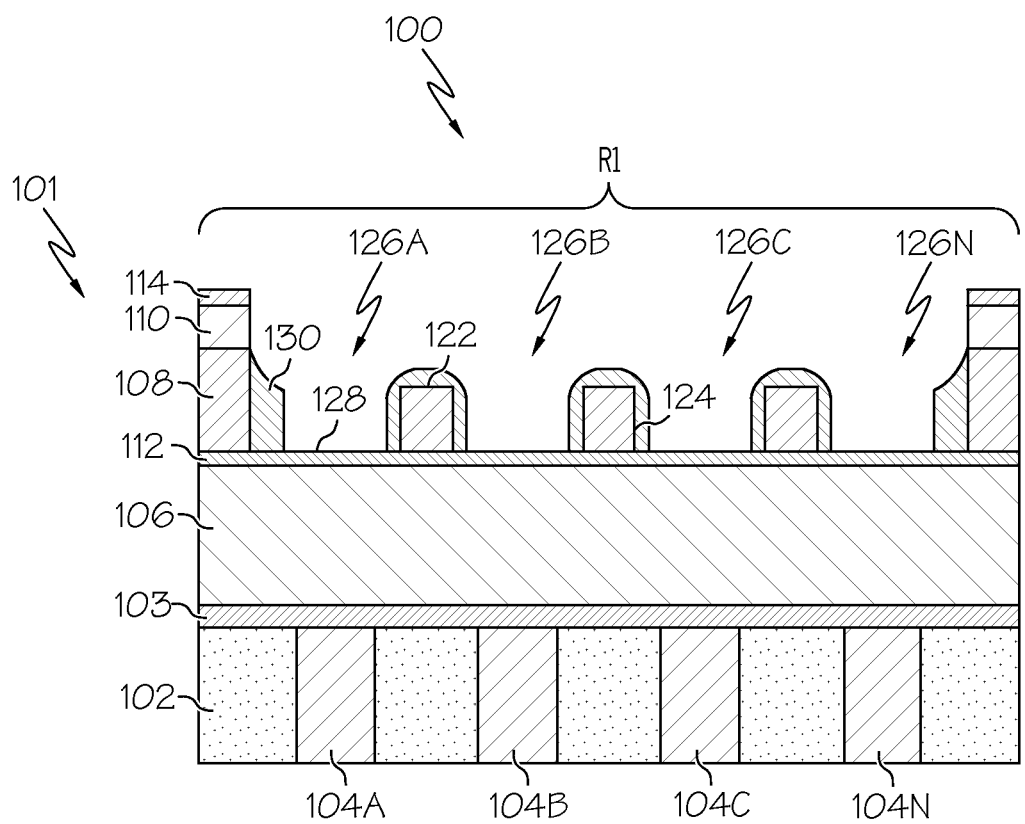
FIG. 6 shows a cross-sectional view of the device following removal of a portion of the sidewall mask layer according to illustrative embodiments.

As shown in FIG. 6, sidewall mask layer 130 is then etched to expose top surface 128 of masking layer 112 using one or more masking and etching sequences. The type of etch utilized depends on the material type of sidewall mask layer 130. For example, if sidewall mask layer 130 comprises an organic material, a strip and dry etch is performed. If sidewall mask layer 130 is an oxide or nitride material, a dry etch can be used. As commonly understood, dry etching includes reactive ion etching (RIE), plasma etching, ion beam etching, laser ablation, or the like.

Figure 7:
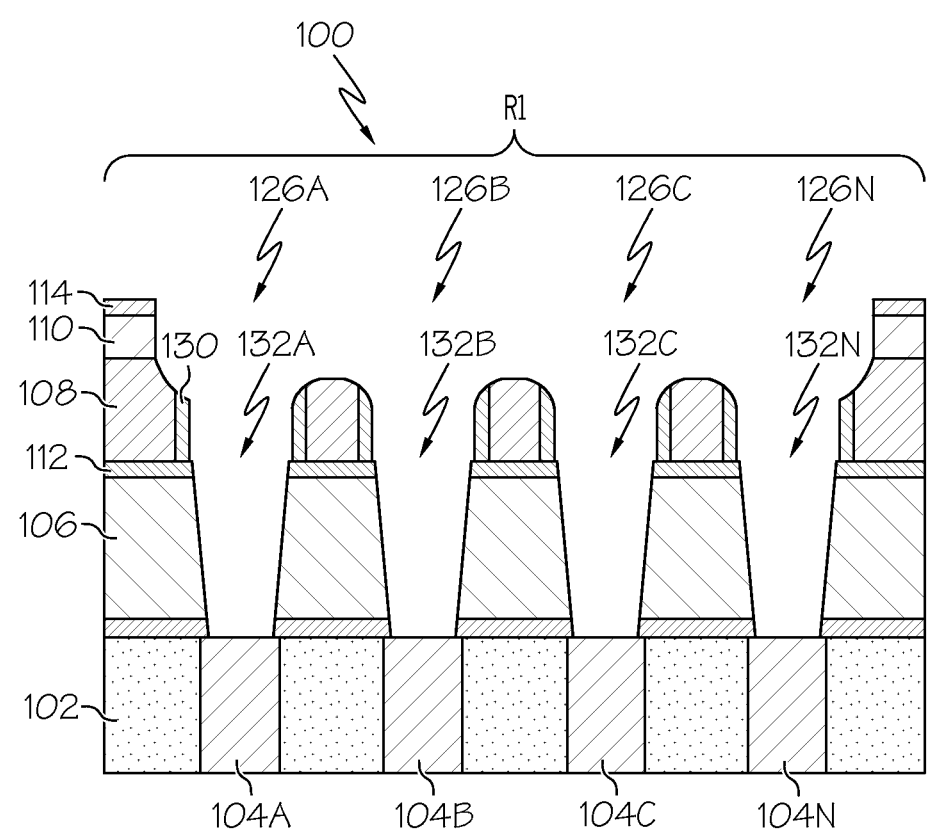
FIG. 7 shows a cross-sectional view of the device following a via etch according to illustrative embodiments.

Next, as shown in FIG. 7, a plurality of vias 132A-N are formed in IC 101 structure through respective openings 126A-N of hard mask 108 in merged via region R1 of device 100. As shown, masking layer 112 and IDL 106 are etched, e.g., by anisotropic RIE, to expose metal lines 104A-N. During this process, sidewall mask layer 130 acts as a sacrificial layer to prevent the via etch from removing too much of hard mask 108 and IDL 106. That is, the etch process used to form vias 132A-N removes material from sidewall mask layer 130 and hard mask 108 during via formation, while minimizing removal of IDL 106 in undesirable areas or in a non-uniform fashion.

Figure 8A:
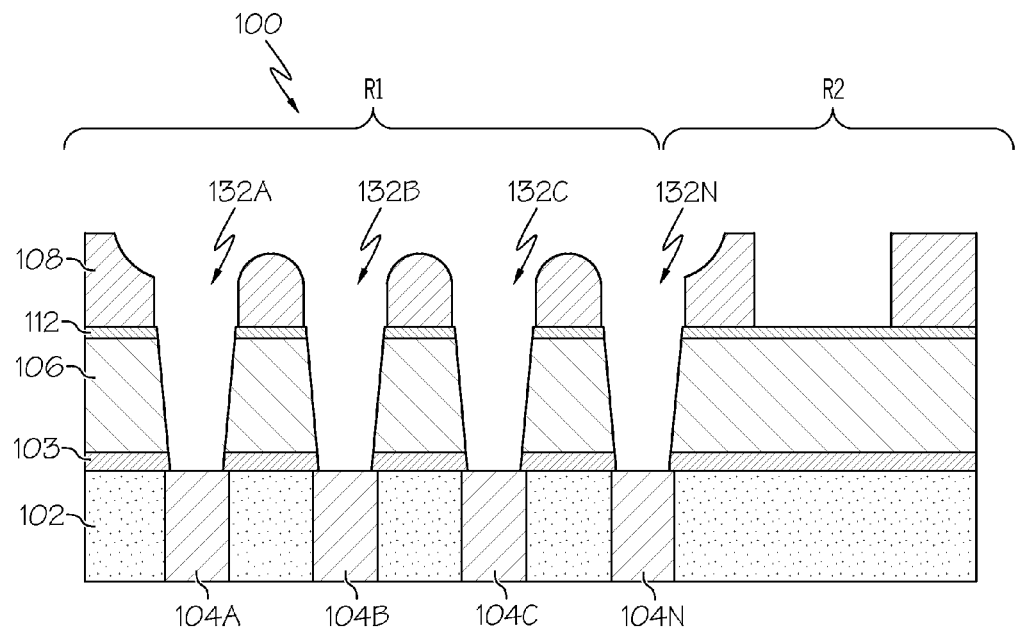
FIG. 8A shows a cross-sectional view of the device following removal of any remaining portions of the sidewall mask layer according to illustrative embodiments.
Figure 8B:
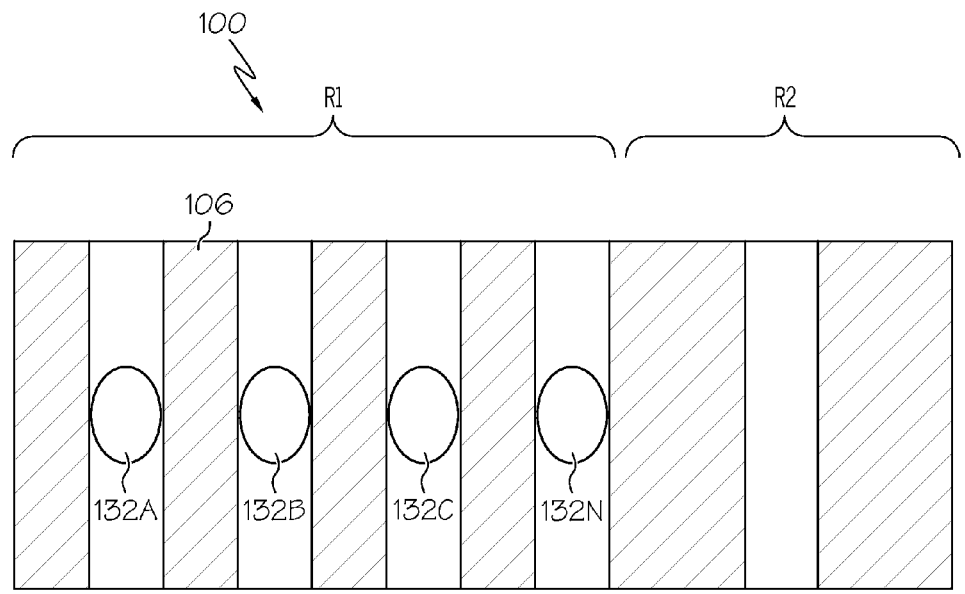
FIG. 8B shows a top view of the device of FIG. 8A following removal of any remaining portions of the sidewall mask layer according to illustrative embodiments.

In some embodiments, portions of sidewall mask layer 130 may remain on sidewall surfaces of hard mask 108 following the via etch, as shown in FIG. 7. In this case, a low-pressure strip can be performed, such as oxygen ashing, or a wet resist strip using sulfuric acid and peroxide, to remove the remaining portion of sidewall mask layer 130, resulting in device 100 shown in FIGS. 8A-B. However, in other embodiments, sidewall mask layer 130 may be completely removed during the via etch. In yet another embodiment, the remaining portion of sidewall mask layer 130 is removed during a subsequent etch of IDL 106 (e.g., during a trench etch). FIGS. 8A-B illustrate a cross-sectional and top view, respectively, of device 100 after the via etch and subsequent removal, if necessary, of any remaining portions of sidewall mask layer 130.

Figure 9A:
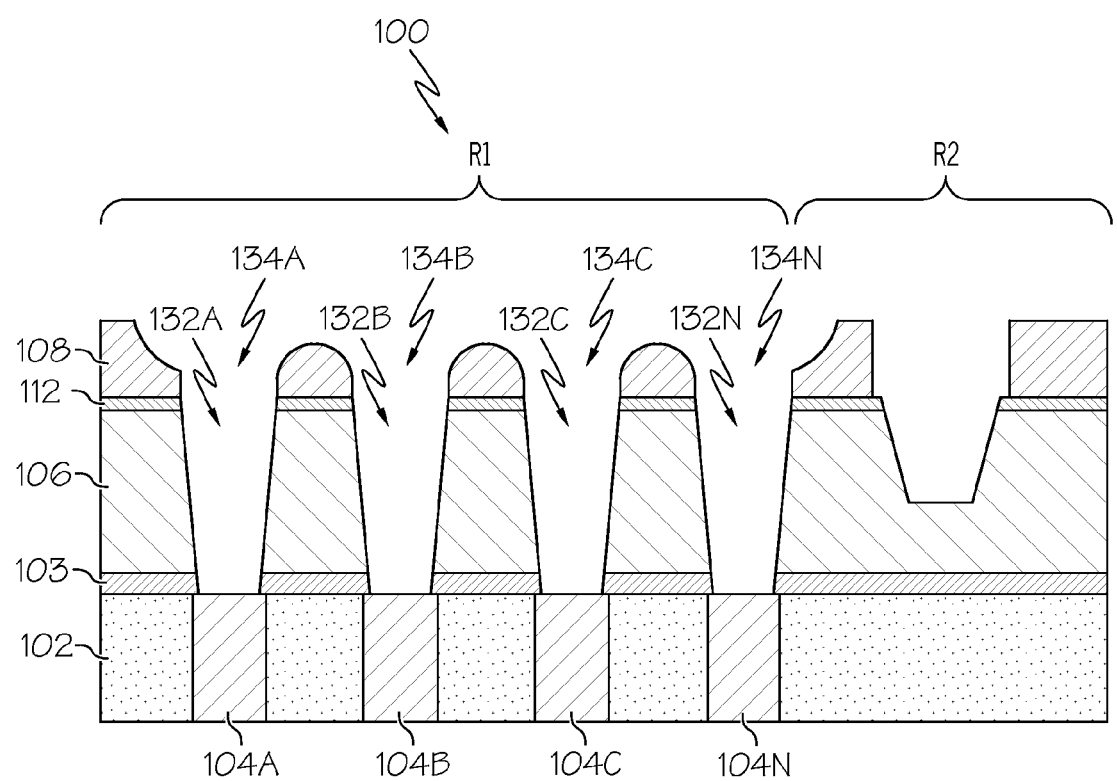
FIG. 9A shows a cross-sectional view of the device following a trench etch according to illustrative embodiments.
Figure 9B:
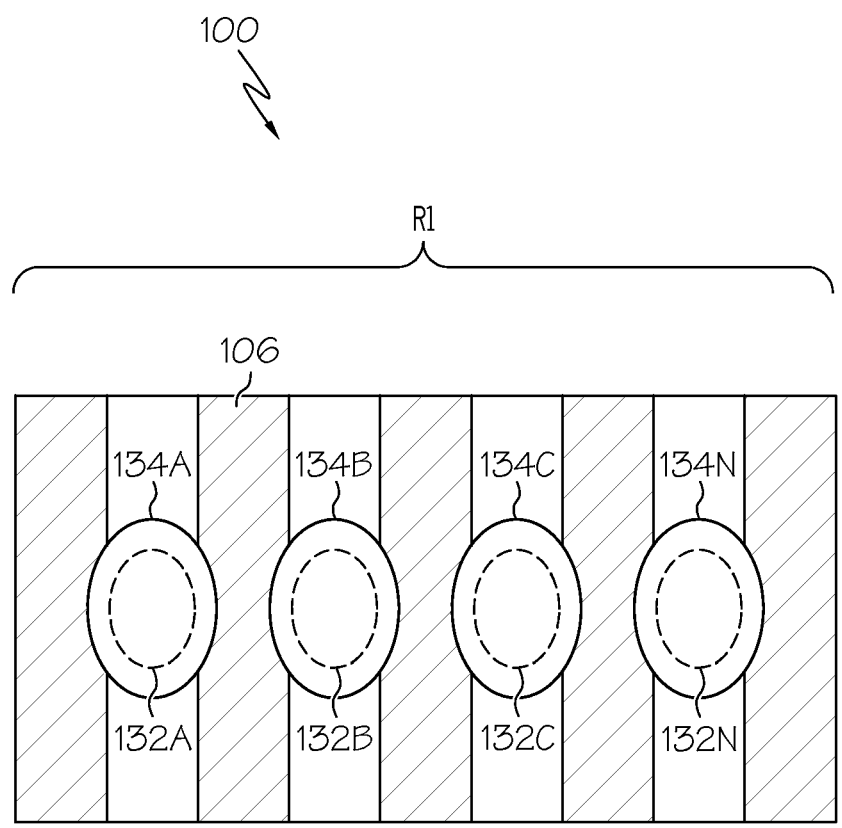
FIG. 9B shows a top view of the device of FIG. 9A following the trench etch according to illustrative embodiments.

Next, as shown in FIG. 9A-B, a plurality of trenches 134A-N are formed in device 100, e.g., using an anisotropic RIE etch. FIGS. 9A-B illustrate a cross-sectional and top view, respectively, of device 100 after etching trenches 134A-N. As shown, trenches 134A-N are aligned with and formed over vias 132A-N, respectively. Following this process step, hard mask 108 in merged via region R1 is exposed to the etch process twice, i.e., the via etch process and the trench etch. This may result in an increased loss in merged via region R1 relative to a non-merged trench region R2, as shown. However, inclusion of sidewall spacer layer 130 (FIGS. 5-7) mitigates the loss to hard mask 108, and consequently to IDL 108106, thus reducing the probability of a line short following a metal layer (e.g., Cu) deposition and CMP (not shown). Sidewall mask layer 130 improves the margin of hard mask 108 for the via etch without sacrificing metal filling capability and defect-related performance.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for interconnect formation in a semiconductor device using a sidewall mask layer. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
providing an integrated circuit (IC) structure comprising:

an interdielectric layer (IDL) formed over a substrate and a capping layer;
a masking layer formed over the IDL;
a hard mask formed over the masking layer, the hard mask including a plurality of openings formed therein; and
a planarization layer formed over the hard mask;
removing the planarization layer exposed by an opening in a masking structure formed over the planarization layer;
forming a sidewall mask layer over the hard mask in a merged via region of the device; and
forming a plurality of trenches in the ILD to expose a set of metal lines beneath the ILD, wherein a portion of the sidewall mask layer is present along a set of sidewalls of the hard mask upon initation of the formation of the plurality of trenches.

2. The method according to claim 1, further comprising:
etching the sidewall mask layer; and
forming a plurality of vias in the IC structure through the plurality of openings of the hard mask prior to the formation of the plurality of trenches.

3. The method according to claim 2, further comprising stripping any remaining portions of the sidewall mask layer following the forming of the plurality of vias.

4. The method according to claim 1, the forming the sidewall mask layer comprising conformally depositing a sidewall mask material over the hard mask and the plurality of openings formed therein.

5. The method according to claim 4, the conformally depositing the sidewall mask material comprising one of the following: an ex-situ thin film deposition, and an in-situ deposition.

6. The method according to claim 4, the sidewall mask material comprising one of the following: a carbon-based material, an oxide material, and a nitride material.

7. The method according to claim 1, wherein the planarization layer comprises an organic planarization layer.

8. The method according to claim 1, further comprising:
forming an anti-reflective layer over the planarization layer;
forming the masking structure over the planarization layer; and
patterning the opening in the masking structure over the merged via region of the device.

9. A method for interconnect formation, the method comprising:
providing a hard mask formed over the interdielectric layer (IDL) of an integrated circuit (IC) structure, the hard mask including a plurality of openings formed therein;
removing a planarization layer formed over the hard mask;
forming a sidewall mask layer over the hard mask in a merged via region of the IC structure;
forming a plurality of vias in the IC structure through the sidewall mask layer and the plurality of openings of the hard mask; and
forming a plurality of trenches in the ILD to expose a set of metal lines beneath the ILD, wherein a portion of the sidewall mask layer is present along a set of sidewalls of the hard mask upon initation of the formation of the plurality of trenches.

10. The method according to claim 9, further comprising:
etching the sidewall mask layer; and
stripping any remaining portions of the sidewall mask layer following the forming of the plurality of vias.

11. The method according to claim 9, the forming the sidewall mask layer comprising conformally depositing a sidewall mask material over the hard mask and the plurality of openings formed therein.

12. The method according to claim 11, the conformally depositing the sidewall mask material comprising one of the following: an ex-situ thin film deposition, and an in-situ deposition.

13. The method according to claim 11, the planarization layer comprising an organic planarization layer, and wherein the sidewall mask material comprises one of the following: a carbon-based material, an oxide material, and a nitride material.

14. The method according to claim 9, further comprising:
forming an anti-reflective layer over the planarization layer;
forming a masking structure over the planarization layer; and
patterning an opening in the masking structure over the merged via region of the IC structure.

15. A method for forming a semiconductor device, the method comprising:
removing an organic planarization layer formed over a hard mask of the semiconductor device;
forming a sidewall mask layer over the hard mask in a merged via region of the semiconductor device;
etching the sidewall mask layer to expose the hard mask; and
forming a plurality of vias in the semiconductor device through a plurality of openings of the hard mask; and
forming a plurality of trenches in an inter dielectric layer (ILD) of the semiconductor device to expose a set of metal lines beneath the ILD, wherein a portion of the sidewall mask layer is present along a set of sidewalls of the hard mask upon initation of the formation of the plurality of trenches.

16. The method according to claim 15, further comprising stripping any remaining portions of the sidewall mask layer following the forming of the plurality of vias.

17. The method according to claim 15, the forming the sidewall mask layer comprising conformally depositing a sidewall mask material over the hard mask and the plurality of openings of the hard mask, and the sidewall mask material comprising one of the following: a carbon-based material, an oxide material, and a nitride material.

18. The method according to claim 15, further comprising:
forming an anti-reflective layer over the planarization layer;
forming a masking structure over the planarization layer; and
patterning an opening in the masking structure over the merged via region of the semiconductor device.

* * * * *